United States Patent
Hwang et al.

(10) Patent No.: US 8,610,162 B2
(45) Date of Patent: Dec. 17, 2013

(54) SEMICONDUCTOR LIGHT EMITTING DEVICE

(75) Inventors: Seok Min Hwang, Busan (KR); Jae Yoon Kim, Gyunggi-do (KR); Jin Bock Lee, Gyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 13/286,807

(22) Filed: Nov. 1, 2011

(65) Prior Publication Data

US 2012/0104444 A1    May 3, 2012

(30) Foreign Application Priority Data

Nov. 1, 2010 (KR) ......................... 10-2010-0107740
Oct. 25, 2011 (KR) ......................... 10-2011-0109268

(51) Int. Cl.
*H01L 33/00* (2010.01)

(52) U.S. Cl.
USPC .................. 257/99; 257/E33.065; 438/22

(58) Field of Classification Search
USPC ............... 257/79–103, E33.001–E33.077, 257/E51.018–E51.022; 438/22–47
See application file for complete search history.

(56) References Cited

U.S. PATENT DOCUMENTS

| | | | | |
|---|---|---|---|---|
| 6,307,218 | B1* | 10/2001 | Steigerwald et al. | 257/99 |
| 2005/0224823 | A1* | 10/2005 | Zhao et al. | 257/91 |
| 2007/0284593 | A1* | 12/2007 | Ko et al. | 257/79 |
| 2008/0210972 | A1* | 9/2008 | Ko et al. | 257/99 |

FOREIGN PATENT DOCUMENTS

| | | |
|---|---|---|
| JP | 2007-329193 | 12/2007 |
| KR | 10-2005-0047695 A | 5/2005 |
| KR | 10-2005-0061743 A | 6/2005 |
| KR | 10-0687527 B1 | 2/2007 |

* cited by examiner

*Primary Examiner* — Julio J Maldonado
*Assistant Examiner* — Daniel Shook
(74) *Attorney, Agent, or Firm* — McDermott Will & Emery LLP

(57) ABSTRACT

A semiconductor light emitting device includes: first and second conductive type semiconductor layers; an active layer disposed between the first and second conductive type semiconductor layers; and first and second electrodes disposed on one surface of each of the first and second conductive type semiconductor layers, respectively, wherein at least one of the first and second electrodes includes a pad part and a finger part formed to extend from the pad part, and the end of the finger part has an annular shape. Because a phenomenon in which current is concentrated in a partial area of the finger part is minimized, tolerance to electrostatic discharge (ESD) can be strengthened and light extraction efficiency can be improved.

25 Claims, 4 Drawing Sheets

SEMICONDUCTOR LIGHT EMITTING DEVICE

CROSS-REFERENCE TO RELATED APPLICATIONS

This application claims the priority of Korean Patent Application Nos. 10-2010-0107740 filed on Nov. 1, 2010 and 10-2011-0109268 filed on Oct. 25, 2011, in the Korean Intellectual Property Office, the disclosure of which is incorporated herein by reference.

BACKGROUND OF THE INVENTION

1. Field of the Invention

The present invention relates to a semiconductor light emitting device.

2. Description of the Related Art

A light emitting diode, a type of semiconductor light emitting device, is a semiconductor device capable of generating light in various colors according to the recombination of electrons and holes at p and n type semiconductor junction parts when current is applied thereto. Compared with a light emitting device based on a filament, the semiconductor light emitting device has various advantages such as a long life span, low power consumption, excellent initial driving characteristics, high vibration resistance, and the like, so demand for the semiconductor light emitting device continues to grow. In particular, recently, III-nitride semiconductor capable of emitting light of a short-wavelength area of a blue line has come to prominence.

A light emitting device using the III-nitride semiconductor is formed by growing a light emission structure including n type and p type nitride semiconductor layers and an active layer formed therebetween on a substrate, and in this case, an ohmic electrode, a bonding electrode, and the like, for applying an electrical signal from the exterior are formed on a surface of the light emission structure. The bonding electrode may include a pad part and a finger part, and the finger part may be employed to apply an overall uniform current to the device. However, although the finger part is employed, current may be concentrated in a portion of the finger part, so in this related art, an improved electrode structure in which current concentration in a portion of a finger part is minimized is required.

SUMMARY OF THE INVENTION

An aspect of the present invention provides a semiconductor light emitting device capable of strengthening tolerance to electrostatic discharge (ESD) and improving light extraction efficiency by minimizing a phenomenon in which current is concentrated into a partial area.

According to an aspect of the present invention, there is provided a semiconductor light emitting device including: first and second conductive type semiconductor layers; an active layer disposed between the first and second conductive type semiconductor layers; and first and second electrodes disposed on one surface of each of the first and second conductive type semiconductor layers, respectively, wherein at least one of the first and second electrodes includes a pad part and a finger part formed to extend from the pad part, and the end of the finger part has an annular shape.

According to another aspect of the present invention, there is provided a semiconductor light emitting device including: first and second conductive type semiconductor layers; an active layer disposed between the first and second conductive type semiconductor layers; and first and second electrodes disposed on one surface of each of the first and second conductive type semiconductor layers, respectively, wherein at least one of the first and second electrodes includes a pad part and a finger part formed to extend from the pad part, and the finger part has an annular shape.

The first electrode may be disposed on the surface of the first conductive type semiconductor layer exposed by removing at least the active layer and the second conductive type semiconductor layer.

The first electrode may be disposed along the fringe of the surface of the first conductive type semiconductor layer.

The finger part may have a width narrower than that of the pad part.

Both first and second electrodes may include the pad part and the finger part.

The finger part of the first electrode may be formed from the pad part of the first electrode and toward the pad part of the second electrode, and the finger part of the second electrode may be formed from the pad part of the second electrode toward the pad part of the first electrode.

Both ends of finger parts of the first and second electrodes may have an annular shape.

Both finger parts of the first and second electrodes may have an annular shape.

The device may further include an ohmic-contact part disposed between the second electrode and the second conductive type semiconductor layer.

The ohmic-contact part may be made of a light-transmissive material.

The first and second electrodes may be made of a light reflective material.

An outer line of the end of the annular finger part may have a circular shape when viewed from above.

The line of an inner hollow area of the end of the annular finger part may have a circular shape when viewed from above.

A portion of the end of the annular finger part may be broken to be open.

A portion of the annular finger part may be broken to be open.

Both ends of the annular finger part may be connected with the pad part to form a closed loop.

The ends of the finger parts included in the first and second electrodes, respectively, may overlap in a direction perpendicular to the direction in which the finger parts extend.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
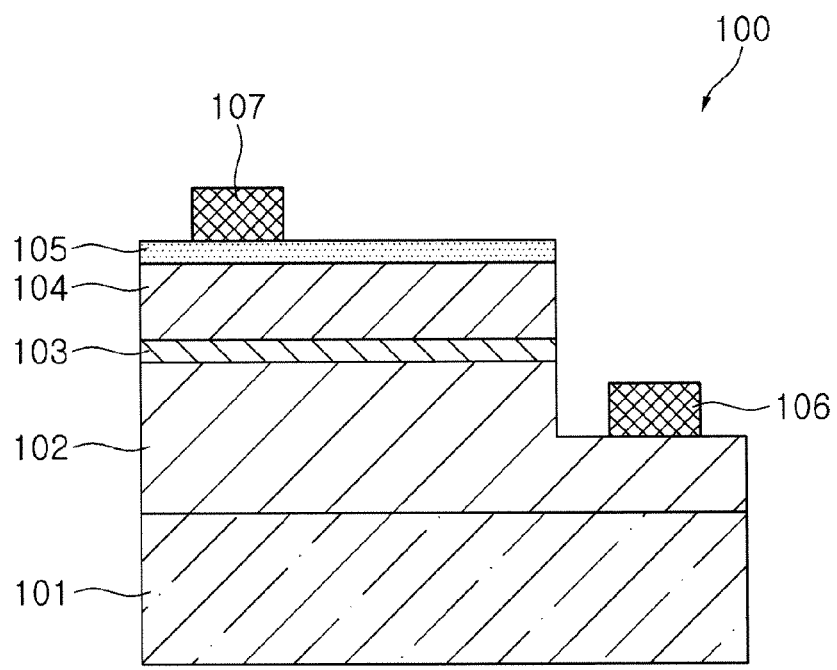
FIG. 1 is a schematic sectional view of a semiconductor light emitting device according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 2:
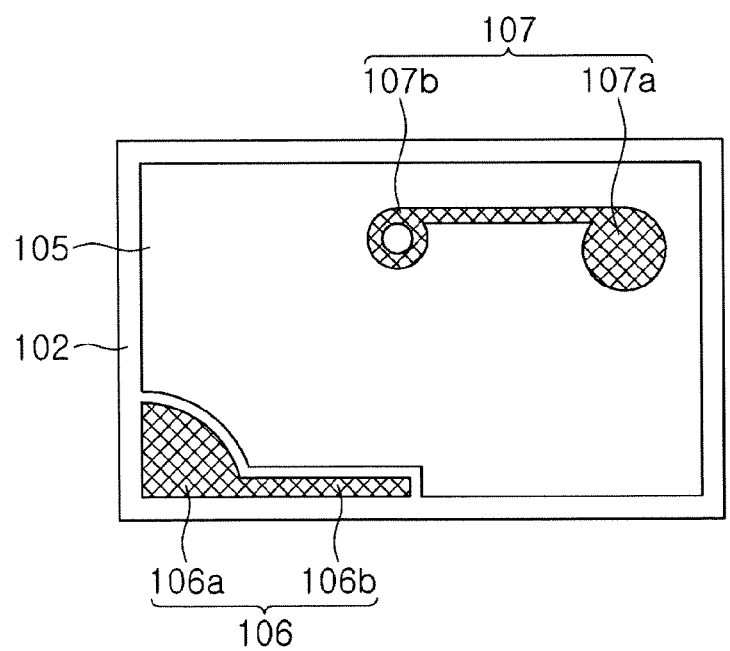
FIG. 2 is a schematic top plan view of the semiconductor light emitting device of FIG. 1.

FIG. 1 is a schematic sectional view of a semiconductor light emitting device according to an embodiment of the present invention. FIG. 2 is a schematic top plan view of the semiconductor light emitting device of FIG. 1. With reference to FIGS. 1 and 2, a semiconductor light emitting device 100 according to an embodiment of the present invention may include a substrate 101, a first conductive type semiconductor layer 102, an active layer 103, and a second conductive type semiconductor layer 104. A first electrode 106 may be formed on one surface of the first conductive type semiconductor layer 102, and an ohmic-contact part 105 and a second electrode 107 may be formed on one surface of the second conductive type semiconductor layer 104.

The substrate 101 may be provided as a semiconductor growth substrate. A substrate made of an electrically insulating or conductive material such as sapphire, SiC, $MgAl_2O_4$, MgO, $LiAlO_2$, $LiGaO_2$, GaN, or the like, may be used as the substrate 101. In this case, sapphire having electrically insulating properties may be most preferably used, and as the electrically insulating substrate 101 is used, an etching process may be performed to form the electrode 106 connected to the first conductive type semiconductor layer 102. Sapphire is a crystal having Hexa-Rhombo R3c symmetry, of which lattice constants in c-axis and a-axis directions are 13.001□ and 4.758□, respectively. Sapphire crystal has a C (0001) face, an A (1120) face, an R (1102) face, and the like. In this case, a nitride thin film can be relatively easily formed on the C face of the sapphire crystal, and because sapphire crystal is stable at high temperatures, it is commonly used as a material of a nitride growth substrate. In this case, however, the substrate 101 may not be requisite for the final device, which may be removed according to circumstances after a semiconductor layer is grown.

The first and second conductive type semiconductor layers 102 and 104 may be formed as semiconductor layers with n type and p type impurities doped thereon, but the present invention is not limited thereto and the first and second conductive type semiconductor layers 102 and 104 may be p type and n type semiconductor layers. Also, the first and second conductive type semiconductor layers 102 and 104 may be made of nitride semiconductor, e.g., a material having a composition of $Al_xIn_yGa_{(1-x-y)}N$ ($0 \leq x \leq 1$, $0 \leq y \leq 1$, $0 \leq x+y \leq 1$). Alternatively, the first and second conductive type semiconductor layers 102 and 104 may be made of AlGaInP-based semiconductor or AlGaAs-based semiconductor. The active layer 103 disposed between the first and second conductive type semiconductor layers 102 and 104 emit light having certain energy according to recombination of electrons and holes, for which a multi-quantum well (MQW) structure in which a quantum well and a quantum barrier are alternately stacked, e.g., a GaN/InGaN structure in case of nitride semiconductor, may be used. Meanwhile, the first and second conductive type semiconductor layers 102 and 104 and the active layer 103 constituting the light emission structure may be grown by using a process, such as metal organic chemical vapor deposition (MOCVD), hydride vapor phase epitaxy (HVPE), a molecular beam epitaxy (MBE), and the like, which are well known in the art.

The ohmic-contact part 105 formed on the second conductive type semiconductor layer 104 may be formed of a transparent conductive oxide such as ITO, CIO, ZnO, or the like, having a superior ohmic-contact performance while maintaining high light transmittance. The ohmic-contact part 105 is not requisite for the present invention and may be excluded or replaced by a different layer according to an embodiment. The first and second electrodes 106 and 107 are provided as areas which come into contact with a conductive wire or a solder bump in order to apply an external electrical signal, may include a light reflective material such as Au, Ag, Al, Cu, Ni, or the like, and may have a multilayered structure such as Cr/Au, Ti/Au, or the like. In this case, the first electrode 106 may be formed on one surface of the first conductive semiconductor layer 102 exposed by removing portions of the active layer 103 and the second conductive type semiconductor layer 104, and the second electrode 107 may be formed on the ohmic-contact part 105.

In the present embodiment, as shown in FIG. 2, the first and second electrodes 106 and 107 include pad parts 106a and 107a and finger parts 106b and 107b formed to extend from the pad parts 106a and 107a, and having a narrower width thereto, respectively, the pad parts 106a and 107a and the finger parts 106b and 107b serve to allow current to be uniformly injected into the light emission structure overall. Namely, the first electrode includes a first pad part 106a and a first finger part 106b extending from the first pad part 106a toward the second pad part 107a, and the second electrode 107 includes a second pad part 107a and a second finger part 107b extending from the second pad part 107a toward the first pad part 106a. In this case, the first pad part 106a and the first finger part 106b formed on the upper surface of the first conductive type semiconductor layer 102 may be formed along the fringe (outer edge) of the upper surface of the first conductive type semiconductor layer 102 so as to be more suitable for current spreading.

In the present embodiment, the end of the second finger part 107b has an annular shape. In this case, the annular shape may correspond to any shape so long as the structure is formed to be hollow. A partial area of the end of the second finger part 107b having an annular shape may be removed to have the shape of a closed loop, thus potentially exposing a portion of the ohmic-contact part 105. Because the end of the second finger part 107b has an annular shape, current can be effectively spread through the end. In general, the finger part is formed to be elongated with a relatively narrow width, so that when a large current is applied thereto, the current is concentrated at the end of the finger part, weakening tolerance to ESD. Comparatively, in the present embodiment, a path allowing current spreading can be relatively increased at the annular end of the second finger part 107b, increasing tolerance to ESD.

When the end of the second finger part 107b is formed to have a plate shape (namely, the interior thereof not being removed), rather than the annular shape, the effect of improving the tolerance to ESD can be obtained; however, in this case, compared with the present embodiment, an area of the ohmic-contact part 105 covered by the second finger part 107b increases to degrade light extraction efficiency. Also, even when a case in which the end having the plate shape and the end having the annular shape have the same area is considered, the end of the finger part having the annular shape is considered to have an area substantially larger than that of the finger part having the plate shape, so the end of the finger part having the annular shape is advantageous for current spreading. Also, as the distance between the first and second electrodes 106 and 107 is reduced, resistance is correspondingly reduced to allow for better electrical characteristics, so the ends of the first and second finger parts 106b and 107b may be formed to overlap in a direction perpendicular to the direction in which the first and second finger parts 106b and 107b extend. Namely, based on FIG. 2, the direction perpendicular to the direction in which the first and second finger parts 106b and 107b extend corresponds to a vertical direction. Such a configuration in which the ends of the first and second finger parts 106b and 107b overlap may be applicable to all of the embodiments hereinafter.

Meanwhile, as shown in FIG. 2, an outer line of the end of the second finger part 107b may have a circular shape when viewed from above, and also, the line of the internal hollow area may be circular. In this case, the circular shape is advantageous for allowing current to be evenly spread. However, the outer line and the line of the internal hollow area are not limited to being circular, and they may have a polygonal shape or an oval shape according to an embodiment.

Figure 3:
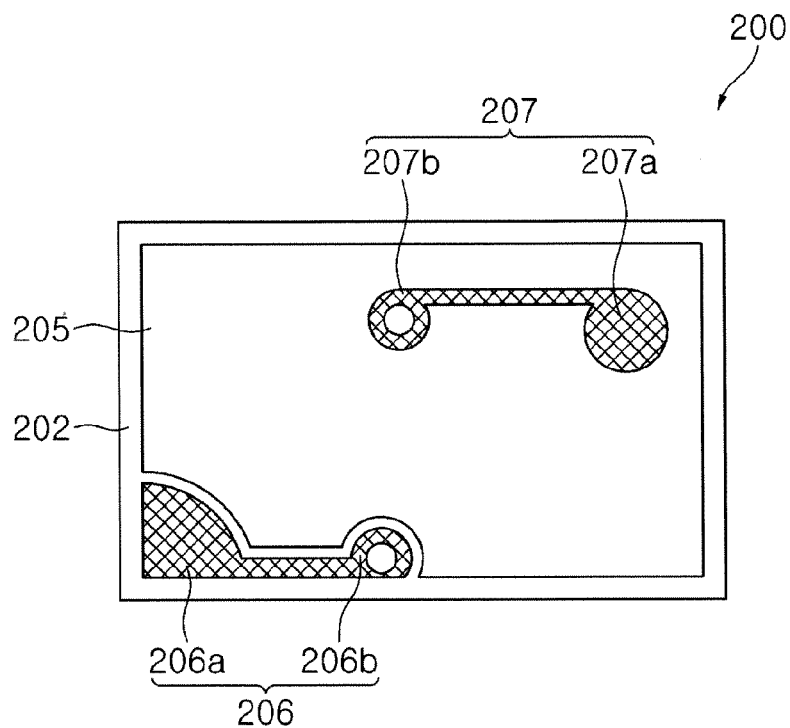
FIG. 3 is a schematic plan view of a semiconductor light emitting device according to another embodiment of the present invention.

Meanwhile, in the foregoing embodiment, the annular finger part is formed only at the second electrode 107. This configuration results from a preferential consideration of the spreading of holes having a low mobility when the second conductive type semiconductor layer 104 is formed of a p type semiconductor, but the annular finger part may also be employed for the first electrode 106. FIG. 3 is a schematic plan view of a semiconductor light emitting device according to another embodiment of the present invention. A semiconductor light emitting device 200 according to the present embodiment is merely different from the foregoing embodiment in that the both electrodes employ the annular fingers. Namely, a first electrode 206 formed on one surface of a first conductive type semiconductor layer 202 includes a pad part 206a and a finger part 206b, and similarly, a second electrode 207 includes a pad part 207a and a finger part 207b, and in this case, both first and second finger parts 206b and 207b are formed to have the end having an annular shape, respectively.

In the present embodiment, because the ends of the first and second finger parts 206b and 207b have the annular shape, current spreading and ESD tolerance can be further improved. Also, in the present embodiment, as the distance between the first and second electrodes 206 and 207 is reduced, resistance is correspondingly reduced, to allow for better electrical characteristics, so the ends of the first and second finger parts 206b and 207b may be formed to overlap in a direction perpendicular to the direction in which the first and second finger parts 206b and 207b extend. Namely, based on FIG. 3, the direction perpendicular to the direction in which the first and second finger parts 206b and 207b extend corresponds to a vertical direction. In particular, in the present embodiment, since the portions corresponding to the annular structure of the first and second finger parts 206b and 207b overlap, electrical characteristics can be further improved.

Figure 4:
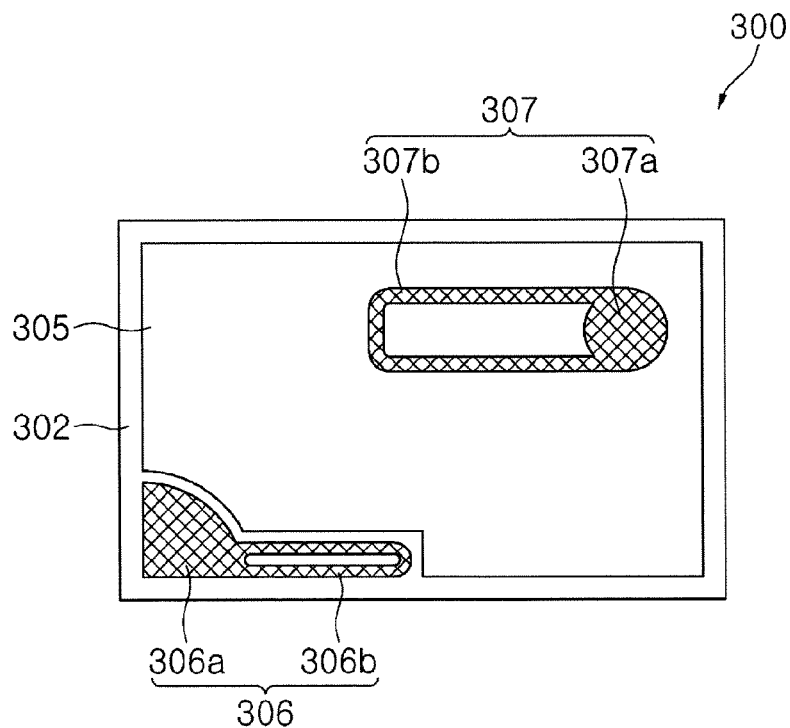
FIG. 4 is a schematic plan view of a semiconductor light emitting device according to another embodiment of the present invention.

FIG. 4 is a schematic plan view of a semiconductor light emitting device according to another embodiment of the present invention. The semiconductor light emitting device according to the present embodiment has a similar function to that of the foregoing embodiment but includes a finger part having a slightly different shape. In detail, in case of a semiconductor light emitting device 300 according to the present embodiment, a first electrode 306 formed on one surface of a first conductive type semiconductor layer 302 includes a pad part 306a and a finger part 306b, and similarly, a second electrode 307 formed on an ohmic-contact part 305 includes a pad part 307a and a finger part 307b. In this case, unlike the foregoing embodiment in which only the ends of the finger parts have an annular shape, in the present embodiment, the first and second finger parts 306b and 307b themselves are formed to have an overall annular shape, and in addition, both ends of the first and second finger parts 306b and 307b are connected with the pad parts 306a and 307a to form a closed loop. Since the first and second finger parts 306b and 307b have such an annular shape, a degradation of light extraction efficiency can be minimized while achieving an improvement in a current spreading function. Here, unlike the illustration of FIG. 4, the closed loop shape may have a side having a curved surface. Also, in the present embodiment, it is illustrated that both of the first and second finger parts 306b and 307b have an annular shape, but only one of the first and second finger parts 306b and 307b may have an annular shape.

Figure 5:
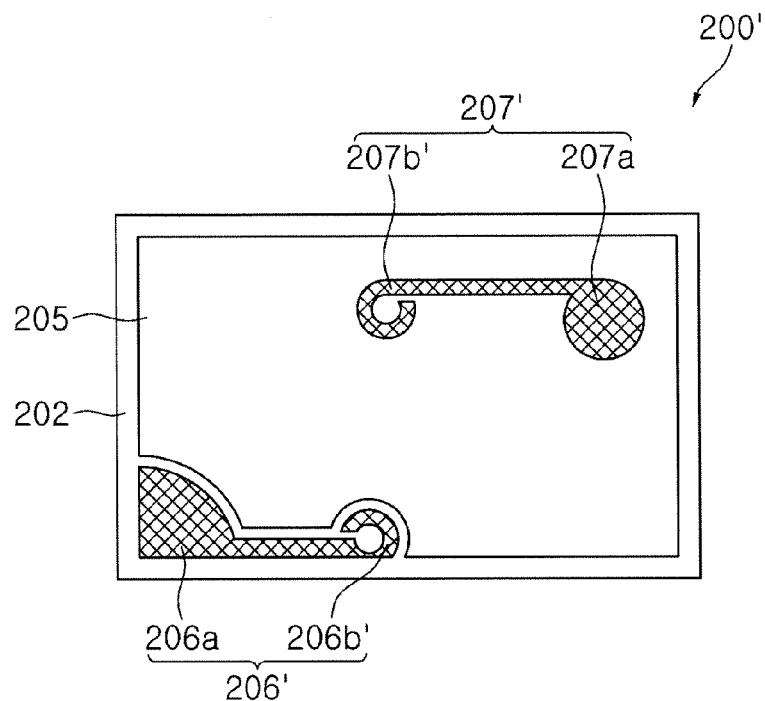
FIGS. 5 and 6 are schematic plan views of modifications of the semiconductor light emitting device in FIGS. 3 and 4, respectively.
Figure 6:
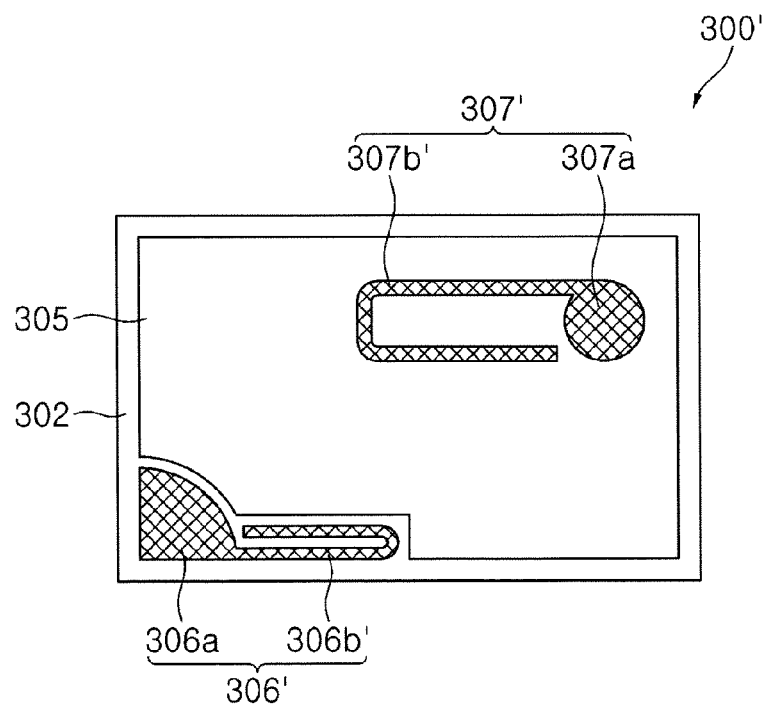

In the foregoing embodiment, a structure in which the end of the annular finger part forms a closed loop has been described, but the annular shape may have a structure in which a portion thereof is removed to be broken. FIGS. 5 and 6 are schematic plan views of modifications of the semiconductor light emitting device in FIGS. 3 and 4, respectively. First, with reference to FIG. 5, in a semiconductor light emitting device 200' according to a modification, a first electrode 206' includes a pad part 206a and a finger part 206b', and similarly, a second electrode 207' formed on an ohmic-contact part 205 includes a pad part 207a and a finger part 207b'. Ends of both the first and second finger parts 206b' and 207b' have an annular shape. Here, however, unlike the embodiment illustrated in FIG. 3, a portion of the ends of the annular first and second finger parts 206b' and 207b' is broken, respectively, to be open, and in this annular structure having a partially open area, the foregoing ESD tolerance can be improved. In this case, in the embodiment of FIG. 5, the ends of both the first and second finger parts 206b' and 207b' are illustrated to have an annular shape, but only one of the first and second finger parts 206' and 207' may have an annular end according to an embodiment. Also, the open area may be positioned in an area different from that illustrated in FIG. 5 in the annular structure.

With reference to FIG. 6, in a semiconductor light emitting device 300' according to a modification, a first electrode 306' includes a pad part 306a and a finger part 306b', and similarly, a second electrode 307' formed on an ohmic-contact part 305 includes a pad part 307a and a finger part 307b'. The first and second finger parts 306b' and 307b' themselves have an annular shape, but, unlike the embodiment illustrated in FIG. 4, respective portions of the annular first and second finger parts 306b' and 307b' are broken to be open, and in this annular structure having a partially open area, the foregoing ESD tolerance can be improved. In this case, in the embodiment of FIG. 6, both the first and second finger parts 306b' and 307b' are illustrated as having an annular shape, but only one of the first and second finger parts 306' and 307' may have an annular shape. Also, the open area may be positioned at an area different from that illustrated in FIG. 6 in the annular structure.

Figure 7:
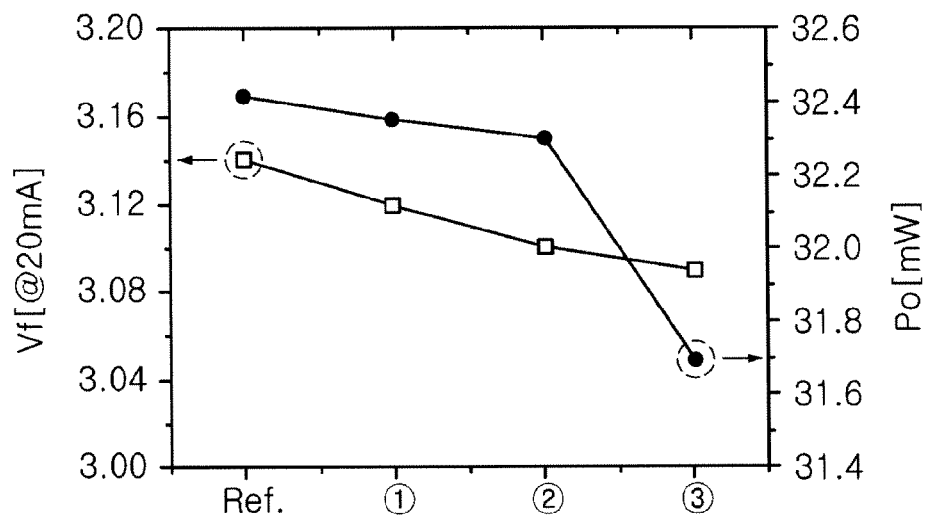
FIG. 7 is a graph of a driving voltage (Vf) and power (Po) measured by changing the shape of the electrodes according to embodiments of the present invention and a comparative example.

The inventor of the present application experimented to determine the difference in performance between the embodiment of the present invention and the Comparative Example. FIG. 7 is a graph of a driving voltage (Vf) and light emission power (Po) measured by changing the shape of the electrodes according to embodiments of the present invention and a comparative example. In the graph of FIG. 7, Ref. has a structure in which ends of the first and second finger parts have neither an annular shape nor a plate shape, and in this structure, the overall finger parts have a bar-like shape. Embodiment ☐ has a structure in which only the end of the second finger part has an annular shape (corresponding to the embodiment illustrated in FIG. 2), and Embodiment ☐ has a structure in which ends of both the first and second finger parts have an annular shape (corresponding to the embodiment illustrated in FIG. 3). Comparative Example ☐ has a structure in which ends of both the first and second finger parts have a plate shape, namely, a structure in which the interiors of the rings (annular shapes) are filled in the embodiment of FIG. 3. With reference to FIG. 7, in comparison to Ref., when the structure having the annular shape or plate shape is employed, a driving voltage Vf may be lowered. In particular, when the structure having an annular shape is employed, although its driving voltage Vf is slightly higher than that of the structure having a plate shape, the structure having an annular shape has a superior effect by about 2% in terms of light emission power (Po).

Figure 8:
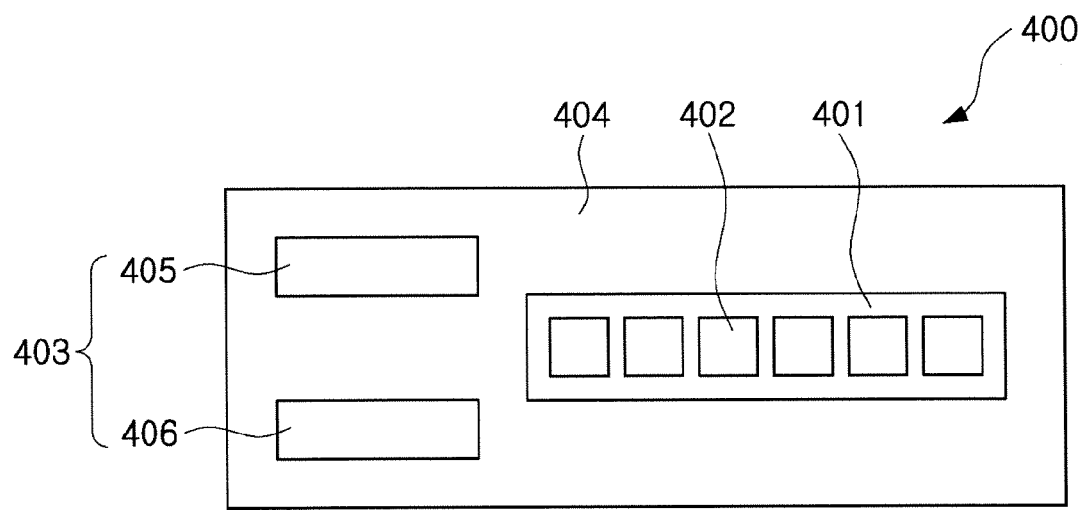
FIG. 8 is a view showing an example of using the semiconductor light emitting device proposed in the present invention.

Meanwhile, the semiconductor light emitting device having the foregoing structure can be applicable to various fields. FIG. 8 is a view showing an example of using the semiconductor light emitting device proposed in the present invention. With reference to FIG. 5, a light dimming apparatus 400 is configured to include a light emitting module 401, a structure 404 in which the light emitting module 401 is disposed, and a power supply unit 403. One or more semiconductor light emitting devices 402 obtained according to the scheme proposed by the present invention may be disposed in the light emitting module 401. In this case, the semiconductor light emitting devices 402 may be respectively mounted as it is on the light emitting module 401 or may be provided in the form of a package in the light emitting module 401. The power supply unit 403 may include an interface 405 for receiving power and a power controller 406 for controlling power supply to the light emitting module 401. In this case, the interface 405 may include a fuse for interrupting overcurrent and an electromagnetic wave shielding filter for shielding an electromagnetic wave trouble signal.

The power controller 406 may include a rectifying unit for converting alternating current (AC) input as power into direct current (DC), and a constant voltage controller for converting a voltage into that suitable for the light emitting module 401. When the power itself is a DC source (e.g., a battery) having a voltage suitable for the light emitting module 401, the rectifying unit or the constant voltage controller may be omitted. Also, when the light emitting module 401 employs an element such as an AC-LED, AC power may be directly supplied to the light emitting module 401, and also in this case, the rectifying unit or the constant voltage controller may be omitted. Also, the power controller may control color temperature, or the like, to provide illumination according to human sensitivity. In addition, the power supply unit 403 may include a feedback circuit device for comparing the level of light emission of the light emitting device 402 and a pre-set amount of light and a memory device storing information regarding desired luminance, color rendering properties, or the like.

The light dimming apparatus 400 may be used as a backlight unit used for a display device such as a liquid crystal display device having an image panel, as an indoor illumination device such as a lamp, an LED flat lighting apparatus, or the like, or as an outdoor illumination device such as a streetlight, a signboard, a warning (sign) post, or the like. Also, the light dimming apparatus 400 may be used as an illumination device for various means of transportation, e.g., road vehicles, ships, aircraft, and the like. In addition, the light dimming apparatus 400 may also be used for home appliances such as a TV, a refrigerator, or the like, or medical instruments, or the like.

As set forth above, according to embodiments of the invention, a phenomenon in which current is concentrated into a partial area is minimized, so tolerance to electrostatic discharge (ESD) can be strengthened and light extraction efficiency can be improved.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device comprising:
   first and second conductive type semiconductor layers;
   an active layer disposed between the first and second conductive type semiconductor layers; and
   first and second electrodes disposed on one surface of each of the first and second conductive type semiconductor layers, respectively, wherein:
   at least one of the first and second electrodes includes a pad part and a finger part formed to extend from the pad part, the end of the finger part has an annular shape, having an internal hollow area.

2. The device of claim 1, wherein the first electrode is disposed on the surface of the first conductive type semiconductor layer exposed by removing at least the active layer and the second conductive type semiconductor layer.

3. The device of claim 2, wherein the first electrode is disposed along the fringe of the surface of the first conductive type semiconductor layer.

4. The device of claim 1, wherein the finger part has a width narrower than that of the pad part.

5. The device of claim 1, wherein both first and second electrodes comprise the pad part and the finger part.

6. The device of claim 5, wherein the finger part of the first electrode is formed from the pad part of the first electrode and toward the pad part of the second electrode, and the finger part of the second electrode is formed from the pad part of the second electrode toward the pad part of the first electrode.

7. The device of claim 5, wherein both ends of the finger parts of the first and second electrodes have an annular shape.

8. The device of claim 5, wherein both finger parts of the first and second electrodes have an annular shape.

9. The device of claim 1, further comprising:
   an ohmic-contact part disposed between the second electrode and the second conductive type semiconductor layer.

10. The device of claim 9, wherein the ohmic-contact part is made of a light-transmissive material.

11. The device of claim 1, wherein the first and second electrodes are made of a light reflective material.

12. The device of claim 1, wherein an outer line of the end of the annular finger part has a circular shape when viewed from above.

13. The device of claim 1, wherein the line of the internal hollow area of the end of the annular finger part has a circular shape when viewed from above.

14. The device of claim 1, wherein a portion of the end of the annular finger part is broken to be open.

15. The device of claim 1, wherein the ends of the finger parts included in the first and second electrodes, respectively, overlap in a direction perpendicular to the direction in which the finger parts extend.

16. A semiconductor light emitting device comprising:
first and second conductive type semiconductor layers;
an active layer disposed between the first and second conductive type semiconductor layers; and
first and second electrodes disposed on one surface of each of the first and second conductive type semiconductor layers, respectively, wherein:
at least one of the first and second electrodes includes a pad part and a finger part formed to extend from the pad part, the finger part has an annular shape, and a line of an internal hollow area of the finger part has a circular shape when viewed from above.

17. The device of claim 16, wherein the first electrode is disposed on the surface of the first conductive type semiconductor layer exposed by removing at least the active layer and the second conductive type semiconductor layer.

18. The device of claim 17, wherein the first electrode is disposed along the fringe of the surface of the first conductive type semiconductor layer.

19. The device of claim 16, wherein the finger part has a width narrower than that of the pad part.

20. The device of claim 16, wherein both first and second electrodes comprise the pad part and the finger part.

21. The device of claim 16, further comprising:
an ohmic-contact part disposed between the second electrode and the second conductive type semiconductor layer.

22. The device of claim 16, wherein the first and second electrodes are made of a light reflective material.

23. The device of claim 16, wherein a portion of the annular finger part is broken to be open.

24. The device of claim 16, wherein both ends of the annular finger part are connected with the pad part to form a closed loop.

25. The device of claim 16, wherein the ends of the finger parts included in the first and second electrodes, respectively, overlap in a direction perpendicular to the direction in which the finger parts extend.

\* \* \* \* \*